(12) United States Patent
Stump et al.

(10) Patent No.: US 7,673,357 B1
(45) Date of Patent: Mar. 9, 2010

(54) BOTTLE OPENING AND PORTABLE DATA STORAGE APPARATUS

(76) Inventors: John R. Stump, 1133 E. Cota St., Suite B, Santa Barbara, CA (US) 93103; Eric Oconnor, 1867 Fort Stockton Dr., San Diego, CA (US) 92103; Jeff D. Behl, 921 Medio Rd., #A, Santa Barbara, CA (US) 93193

( * ) Notice: Subject to any disclaimer, the term of this patent is extended or adjusted under 35 U.S.C. 154(b) by 119 days.

(21) Appl. No.: 12/117,192

(22) Filed: May 8, 2008

Related U.S. Application Data

(60) Provisional application No. 60/928,664, filed on May 11, 2007.

(51) Int. Cl.
*B67B 7/16* (2006.01)
(52) U.S. Cl. ............................................. 7/151; 81/3.09
(58) Field of Classification Search .................... 7/151; 81/3.09, 355, 3.57; D8/33, 34, 40
See application file for complete search history.

(56) References Cited

U.S. PATENT DOCUMENTS

| | | | | |
|---|---|---|---|---|
| 4,642,827 A | * | 2/1987 | Karuzas | 7/151 |
| 5,535,644 A | * | 7/1996 | Paul-Alexandre et al. | 81/3.09 |
| 7,146,667 B2 | * | 12/2006 | Elsener | 7/118 |
| 2006/0139861 A1 | * | 6/2006 | Krieger et al. | 361/679 |

* cited by examiner

*Primary Examiner*—D. S Meislin
(74) *Attorney, Agent, or Firm*—Richard S Erbe

(57) ABSTRACT

An apparatus for opening bottles and storing data has an enclosure formed from a pair of semi-enclosed casings that includes a gripping member having a pair of tabs for grasping and removing caps from bottles. The enclosure provides a protective shell for a portable data storage device that may be pivoted outwardly from within the enclosure when the device is in use. The data storage device includes a universal serial bus plug and can be used with any electronic device having a universal serial bus port, such as a desktop computer, notebook computer, communications device, and the like. The apparatus may be carried separately or can be attached to another carrying device or hung on a hook.

14 Claims, 8 Drawing Sheets

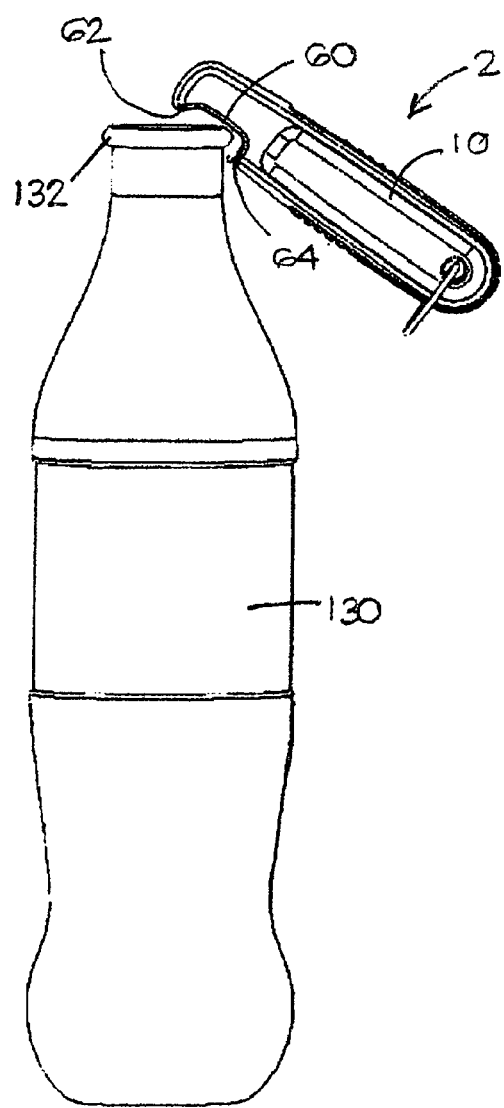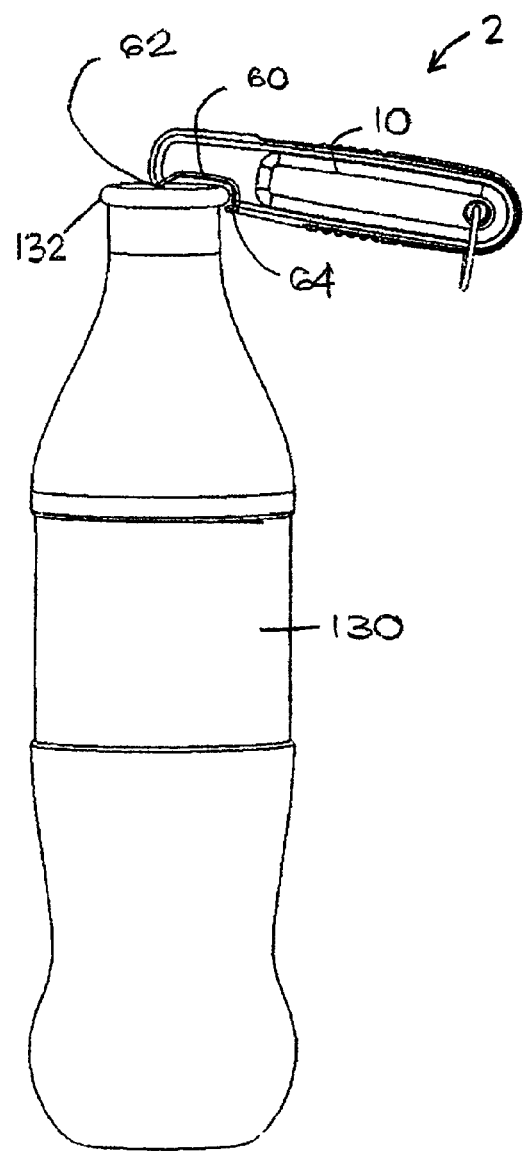
FIG. 5
FIG. 6

BOTTLE OPENING AND PORTABLE DATA STORAGE APPARATUS

RELATED APPLICATIONS

This application claims the benefit of U.S. Provisional Application for Patent application No. 60/928,664 filed May 11, 2007, incorporated herein by reference.

BACKGROUND OF THE INVENTION

1. Field of the Invention

The present invention relates to bottle opening devices and, more specifically, to a bottle opener that also functions as a portable data storage device.

2. General Background and State of the Art

Various embodiments of portable data storage devices and bottle openers are known and have been in use for years. Usually, such devices are configured and used separately; bottle openers don't include data storage devices and visa versa. A bottle opener tends to be stored in a kitchen drawer among other objects, and when it is needed, it sometimes takes a while to find it, because one is first trying to remember which drawer it is in and then trying to find it amidst the clutter caused by all of the other items that invariably are kept in the same drawer (scissors, tape, glue, etc.).

Portable data storage devices, on the other hand, tend to be carried on key chains, along with various other devices, which can clutter up a key chain and make the storage device difficult to use or fit into tight spaces.

The inventors are unaware of any product that combines the functions of bottle opening and data storage. Such an item would probably be carried as a separate item, thus relieving the common problem of having to search for, or losing a bottle opener. It would also be desirable if such a product could also provide a safe and durable way to protect the stored data but would also allow for this function to be easily used, even in tight spaces.

In these respects, the apparatus according to a preferred embodiment of the present invention substantially departs from conventional concepts and designs of prior art bottle opening devices and portable data storage devices.

SUMMARY OF THE INVENTION

Accordingly, it is an object of the invention to provide a multi-function apparatus that is capable of opening bottle caps and storing data.

Another object of the invention is to provide a multi-function apparatus that is portable and convenient to carry.

An additional object of the invention is to provide a multi-function apparatus that provides protection for stored data.

Yet another object of the invention is to provide a multi-function apparatus that is easy to use.

In an apparatus embodying the principles of the invention, an enclosure formed from a pair of semi-enclosed casings includes a gripping member having a pair of tabs for grasping and removing caps from bottles, while also providing protection for a portable storage device that may be pivoted outwardly from within the enclosure when the device is in use. Such a configuration provides the user with a useful multi-function apparatus that avoids many of the problems associated with separate individual products that each perform only one of the functions performed by the apparatus disclosed herein.

The enclosure includes a longitudinal opening through which the portable data storage device may be accessed and through which it may be moved outwardly when it is desired to be used. The apparatus according to a preferred embodiment of the present invention includes a conventional portable data storage device having a universal serial bus ("USB") plug than may be used with many known devices, such as desktop computers, notebook computers, personal data assistants, and communications devices.

Apertures in the enclosure and in the portable storage device can be aligned so that the storage device can be pivoted outwardly from the enclosure when desired and also facilitates the use of a mounting ring that can be used to hang or mount the apparatus on a hook or like device for storage and carrying.

In another aspect of the apparatus according to a preferred embodiment of the present invention, a method of storing data on the data storage device is disclosed. When the user desires to store data from an electronic device having a USB port, the data storage device is pivoted outwardly from the enclosure, providing access to the USB plug on the data storage device. The USB plug may then be plugged into the USB port and the data is transferred to the data storage device. When the operation is complete, the data storage device is removed from the electronic device and the data storage device may then be pivoted so that it is completely inside the enclosure, thus providing a secure and safe place for the data storage device and the data that it holds.

Further objects and advantages of the present invention will become more apparent from the following description of a preferred embodiment, which, taken in conjunction with the accompanying drawings, will illustrate, by way of example, the principles of the invention.

BRIEF DESCRIPTION OF THE DRAWINGS

The foregoing and other objects, aspects and advantages will be better understood from the following detailed description of the preferred embodiment of the invention with reference to the drawings, in which:

FIGS. 5 and 6 illustrate perspective views of a bottle opening and portable data storage apparatus according to a preferred embodiment of the present invention and how it may be used to open bottles;

DETAILED DESCRIPTION OF THE PREFERRED EMBODIMENT OF THE INVENTION

In the following description of the present invention, reference is made to the accompanying drawings, which form a part thereof, and in which are shown, by way of illustration, an exemplary embodiment illustrating the principles of the present invention and how it may be practiced. It is to be understood that other embodiments may be utilized to practice the present invention and structural and functional changes may be made thereto without departing from the scope of the present invention. It is to be further understood that the terminology and phraseology used herein are for the purpose of description and should not be considered as limiting.

Figure 2:
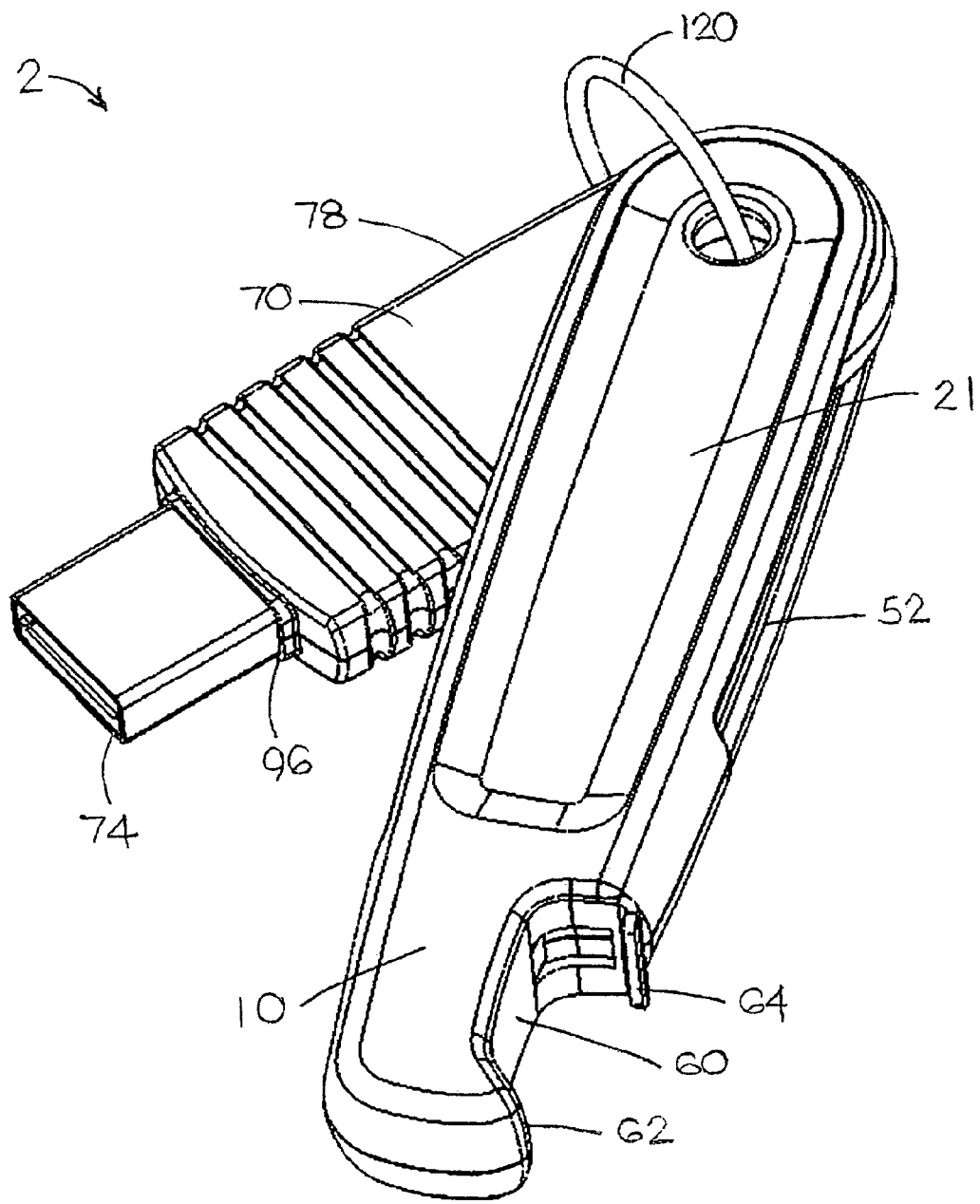
FIG. 2 illustrates a perspective view of a bottle opening and portable data storage apparatus according to a preferred embodiment of the present invention, with the portable storage device in a partially-enclosed position.
Figure 3:
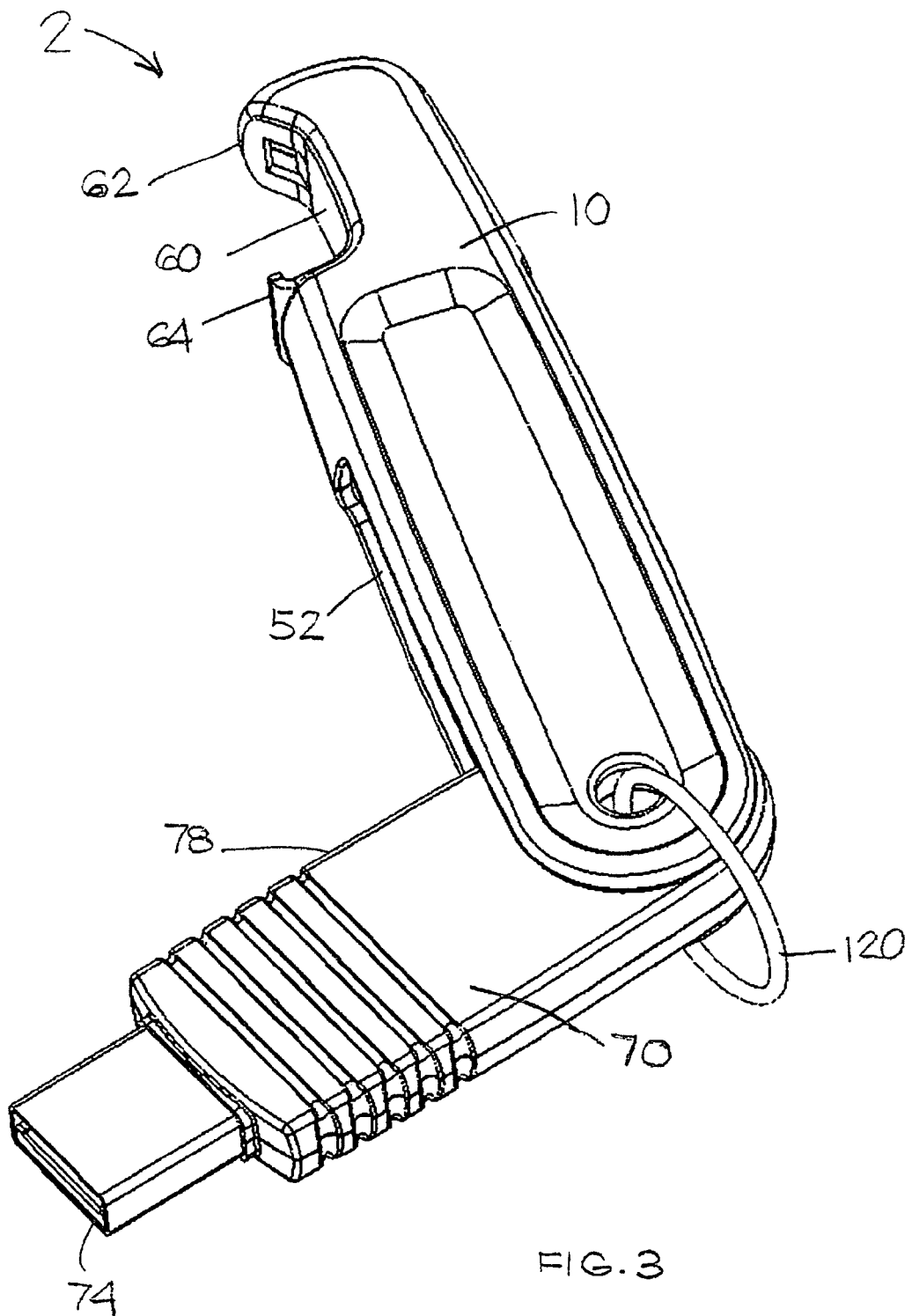
FIG. 3 illustrates another perspective view of a bottle opening and portable data storage apparatus according to a preferred embodiment of the present invention, with the portable storage device in a partially-enclosed position.
Figure 4:
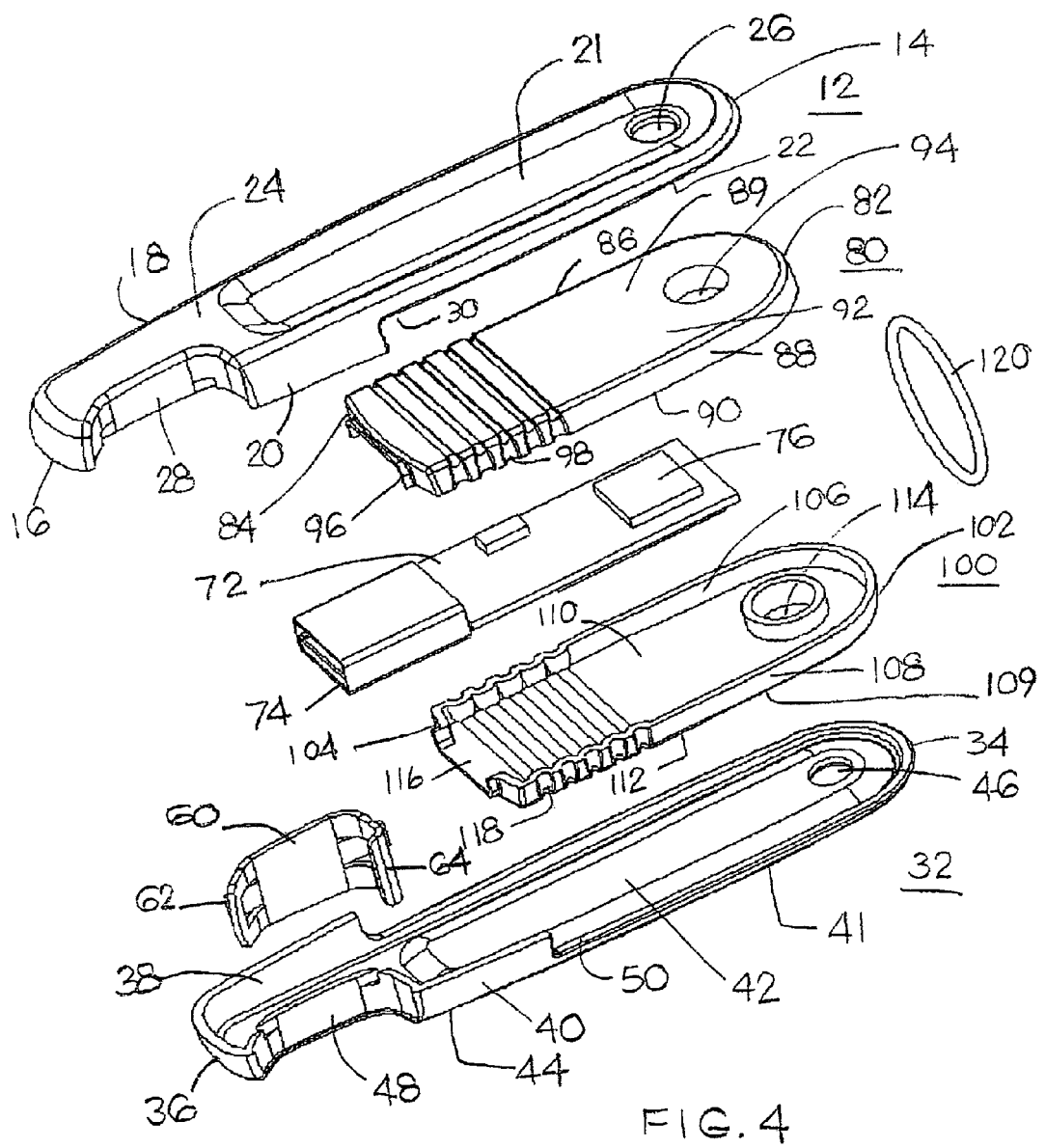
FIG. 4 illustrates an exploded view of a bottle opening and portable data storage apparatus according to a preferred embodiment of the present invention.

A bottle opening and portable data storage apparatus according to a preferred embodiment of the invention is illustrated in FIGS. 1-4 and generally indicated by the numeral 2. As best shown in FIG. 4, the apparatus includes hollow enclosure 10, which includes partially-enclosed upper casing 12 and partially-enclosed lower casing 32. In the preferred embodiment of the invention, partially enclosed upper casing 12 and partially-enclosed lower casing 32 are minor images of each other.

Partially-enclosed upper casing 12 includes a first end 14, second end 16, a pair of opposed side walls 18 and 20, a top wall 21 having inner surface 22 and outer surface 24. Side wall 20 also includes indentation 28 and longitudinal slot 30, the purposes of which will be described shortly. It should be noted that indentation 28 and longitudinal slot 30 could be located along side wall 18 without departing from the scope of the invention. Partially-enclosed upper casing 12 also includes aperture 26 in top wall 21.

Partially-enclosed lower casing 32, which, as previously mentioned, is, in the preferred embodiment of the invention, the mirror image of partially-enclosed upper casing 12, includes a first end 34, second end 36, a pair of opposed side walls 38 and 40, and bottom wall 41 having inner surface 42 and outer surface 44. Side wall 40 also includes indentation 48 and longitudinal slot 50, the purposes of which will be described shortly. It should be noted that indentation 48 and longitudinal slot 50 could be located along side wall 38 without departing from the scope of the invention. Partially-enclosed lower casing 32 also includes aperture 46 in bottom wall 41.

When partially-enclosed upper casing 12 and partially-enclosed lower casing 32 are attached to one another, a longitudinal opening 52 is formed at the juncture of longitudinal slots 30 and 50, which provides access to the data storage device 70.

A gripping member 60, which includes a pair of gripping tabs 62 and 64, is mounted on enclosure 10 where indentations 28 and 48 adjoin. The inclusion of gripping member 60 and gripping tabs 62 and 64 enable apparatus 2 to function as a bottle opener, as illustrated in FIGS. 5 and 6. Gripping tabs 62 and 64 are applied to bottle cap 132 on bottle 130, and apparatus 2 is moved in such a manner that it removes bottle cap 132.

Data storage device 70, as best illustrated in FIG. 4, includes a base 72, USB plug 74, and memory card 76 enclosed in a housing 78. Housing 78 is generally configured from upper housing element 80 and lower housing element 100. In the preferred embodiment of the apparatus 2 according to the present invention, upper housing element 80 and lower housing element 100 are minor images of one another.

Upper housing element 80 includes first end 82, second end 84, a pair of opposed side walls 86 and 88, and top wall 89 having inner surface 90 and outer surface 92. An aperture 94 is disposed adjacent first end 82 in top wall 89. Slot 96 is formed at second end 84. Upper housing element 80 also includes ribbed portion 98.

Lower housing element 100 includes first end 102, second end 104, a pair of opposed side walls 106 and 108, and bottom wall 109 having inner surface 110 and outer surface 112. An aperture 114 is disposed adjacent first end 102 in top wall 109. Slot 116 is formed at second end 104. Lower housing element 100 also includes ribbed portion 118.

When upper housing element 80 and lower housing element 100 are attached to each other to form housing 78, plug 74 is disposed through the opening formed by the juncture of slots 96 and 116.

In the preferred embodiment of apparatus 2, apertures 26, 46, 94 and 114 are in alignment, allowing for mounting ring 120 to be inserted through them. Mounting ring 120 allows apparatus 2 to be mounted on other items or hung on a hook or the like when not in use.

Figure 1:
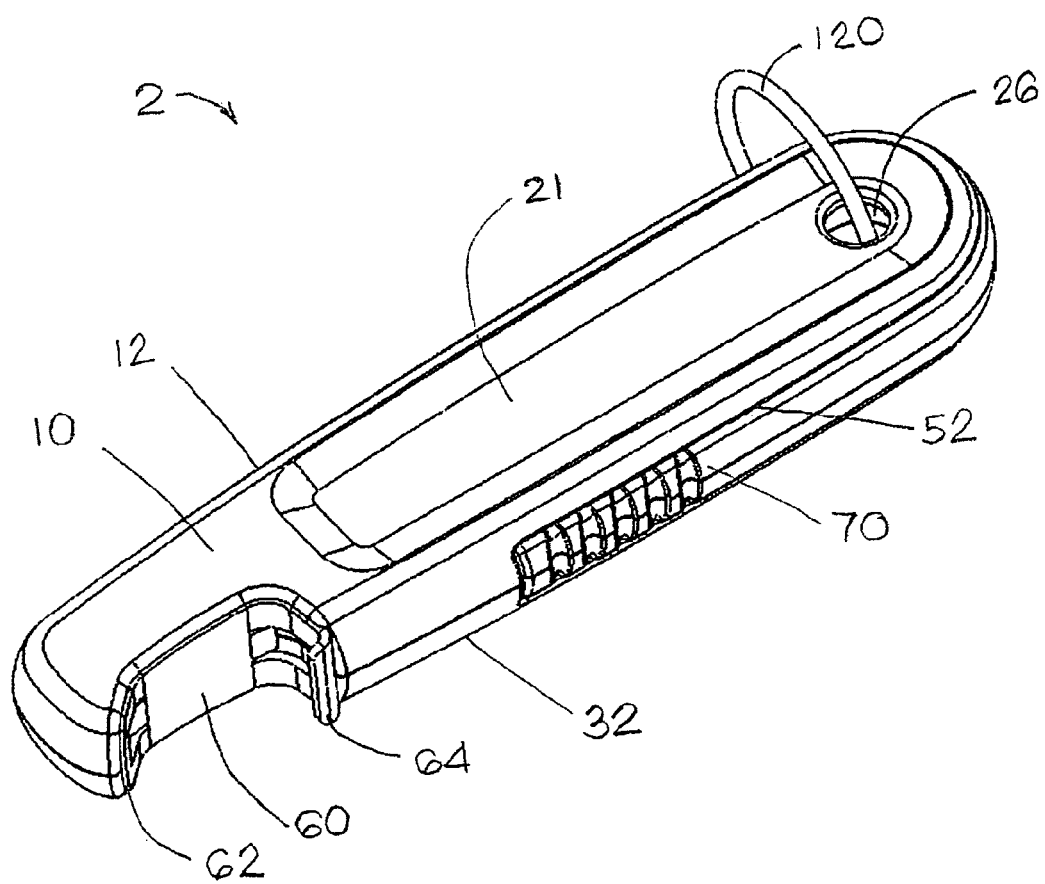
FIG. 1 illustrates a perspective view of a bottle opening and portable data storage apparatus according to a preferred embodiment of the present invention, with the portable data storage device in its fully-enclosed position.

In the preferred embodiment of apparatus 2, data storage device 70 is pivotably mounted to enclosure 10 and sized so that it may be pivoted from a fully-enclosed position inside of enclosure 10 through longitudinal opening 52 to a partially-enclosed position, as illustrated in FIGS. 1-3.

Figure 7:
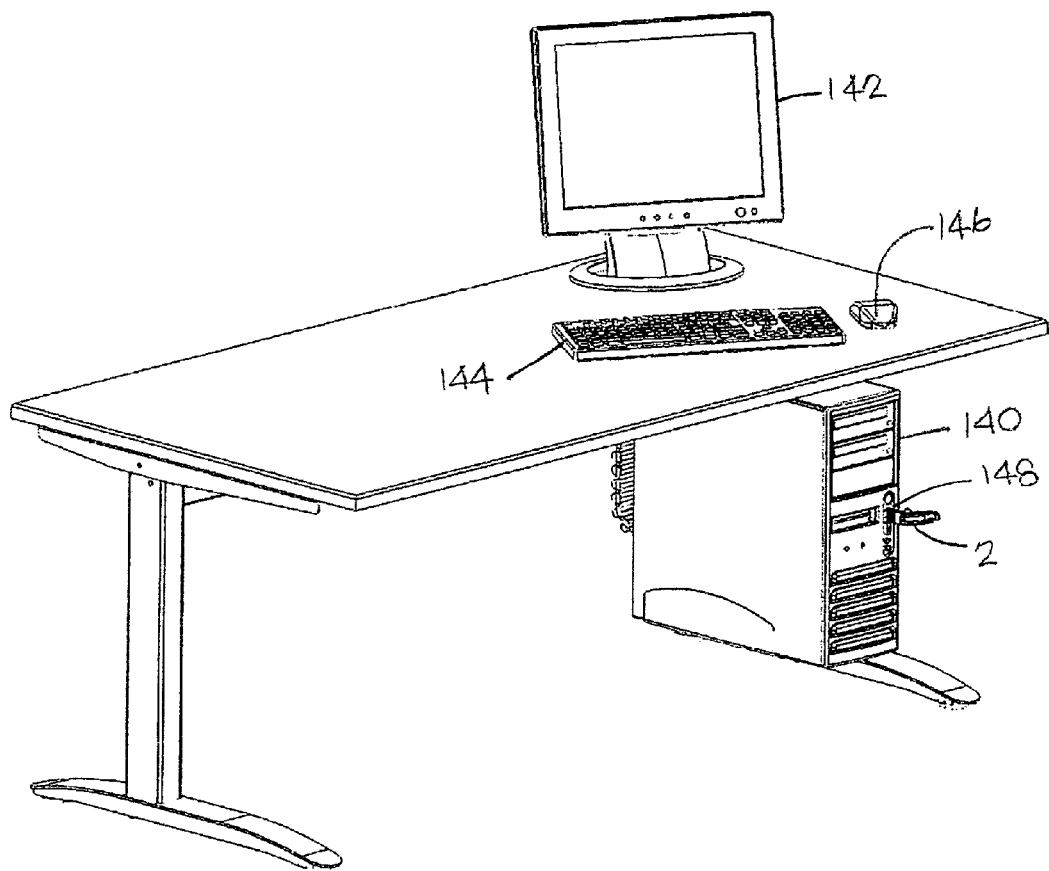
FIG. 7 illustrates a perspective view of a bottle opening and portable data storage apparatus according to a preferred embodiment of the present invention in use with a computer.
Figure 8:
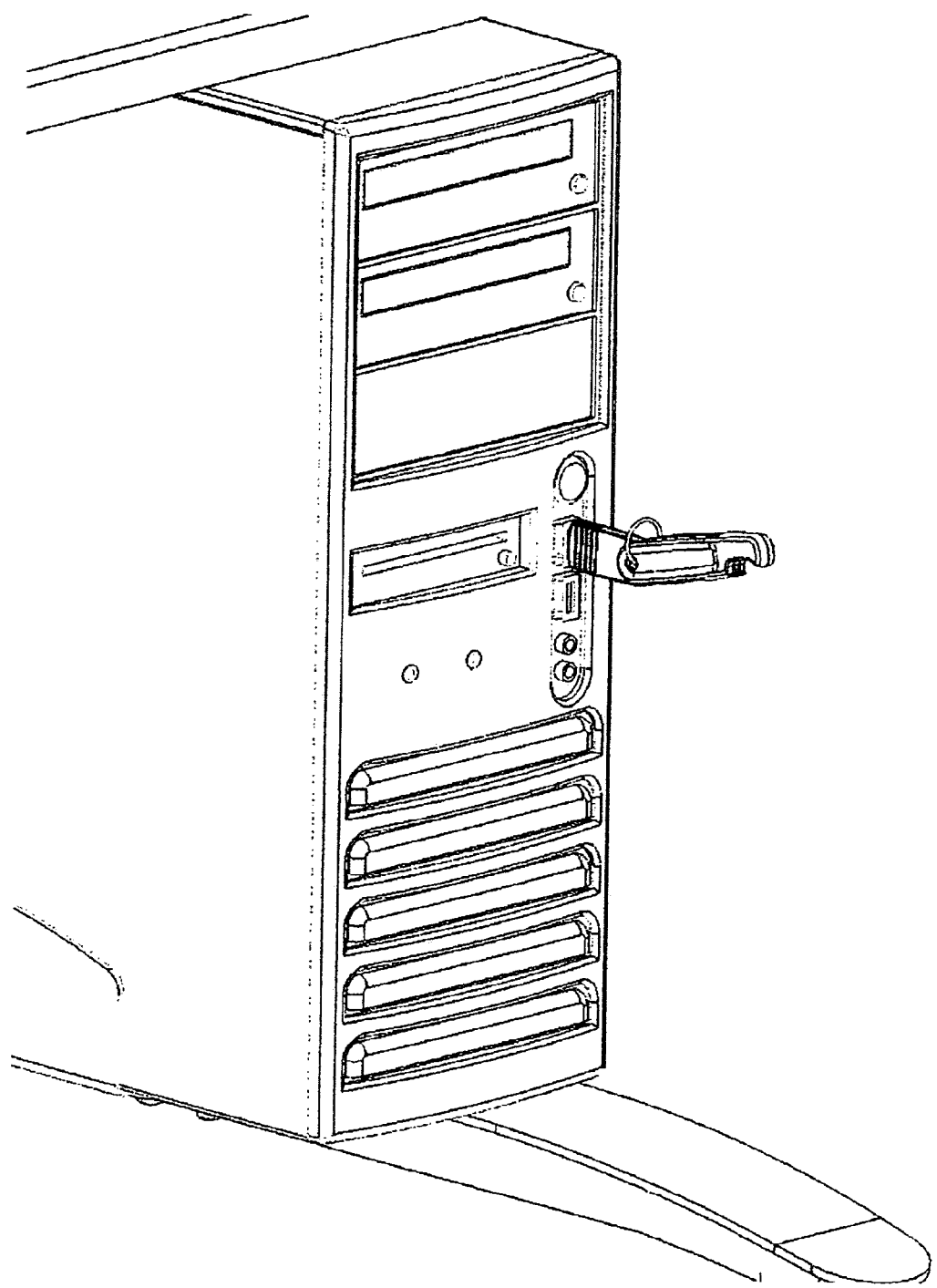
FIG. 8 illustrates another perspective view of a bottle opening and portable data storage apparatus according to a preferred embodiment of the present invention in use with a computer.
Figure 9:
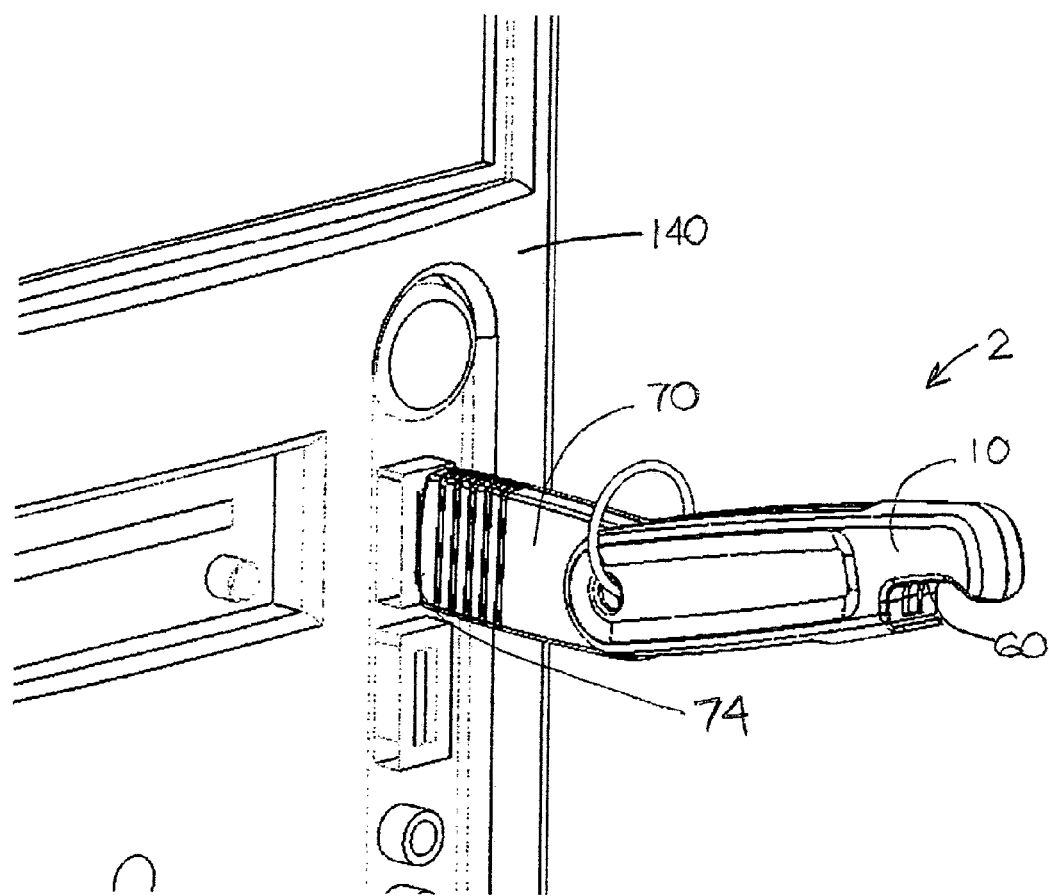
FIG. 9 illustrates another perspective view of a bottle opening and portable data storage apparatus according to a preferred embodiment of the present invention in use with a computer.

FIGS. 7-9 illustrate how apparatus 2 functions as a data storage device. The following example describes the use of apparatus 2 in conjunction with what is generally known as a desktop computer, but it is to be understood that the present invention may be used with any electronic device having a USB port.

The electronic device used in the following example is shown in FIGS. 7-9 and generally consists of a computer 140, display 142, input device 144 (in this example, a keyboard), and a pointing device 146 (in this example, a mouse). Computer 140 includes one or more USB ports 148.

Using apparatus 2 as a data storage device includes providing computer 140 having at least one USB port 148 and data stored in computer 140. Apparatus 2 is provided to store data from computer 140. Data storage device 70 is pivoted through longitudinal opening 52 in enclosure 10 from a fully-enclosed position into a partially-enclosed position, exposing USB plug 74. USB plug 74 is then inserted into USB port 148, and data is transferred to data storage device 70. After the data transfer is completed, USB plug 74 is removed from USB port 148. Data storage device 70 may then be pivoted through longitudinal opening 52 back to a fully-enclosed position inside enclosure 10. This position provides the ability to safely and securely store the data on data storage device 70 and helps to preserve the data and data storage device 70 from loss or damage due to impacts.

The foregoing description of an exemplary embodiment of the present invention has been presented for purposes of enablement, illustration, and description. It is not intended to be exhaustive of or to limit the present invention to the precise form discussed. There are, however, other bottle opening and portable data storage apparatuses not specifically described herein, but with which the present invention is applicable. The present invention should therefore not be seen as limited to the particular embodiment described herein.

What is claimed is:

1. A bottle opening and data storage apparatus comprising:

a hollow enclosure having a gripping member, said gripping member having a pair of gripping tabs, wherein said hollow enclosure further comprises:
  a partially-enclosed upper casing having a first end, a second end, a pair of opposed side walls, a top wall having an inner surface and an outer surface, an aperture disposed adjacent said first end in said top wall, an indentation in one of said side walls, and a longitudinal slot in one of said side walls; and
  a partially-enclosed lower casing attached to said partially-enclosed upper casing, said partially-enclosed lower casing having a first end, a second end, a pair of opposed side walls, a bottom wall having an inner surface and an outer surface, an aperture disposed adjacent said first end in said bottom wall, an indentation in one of said side walls, and a longitudinal slot in one of said side walls;
and
a data storage device mounted within said hollow enclosure.

2. The apparatus according to claim 1, wherein said partially-enclosed lower casing is the mirror image of the partially-enclosed upper casing.

3. The apparatus according to claim 2, wherein said gripping member is mounted to the enclosure where the indentations adjoin each other.

4. The apparatus according to claim 2, further comprising a longitudinal opening where said longitudinal slots adjoin each other.

5. The apparatus according to claim 4, wherein said data storage device comprises:
  a housing enclosing a base, a memory card, and a universal serial bus plug, said housing further comprising:
    an upper housing element having a first end, a second end, a pair of opposed side walls, a top wall having an inner surface and an outer surface, an aperture disposed adjacent said first end in said top wall, and a slot formed in said second end; and
    a lower housing element attached to said upper housing element, said lower housing element having a first end, a second end, a pair of opposed side walls, a bottom wall having an inner surface and an outer surface, an aperture disposed adjacent said first end in said lower wall, and a slot formed in said second end, whereby said plug extends through the slots at said second ends.

6. The apparatus according to claim 5, wherein said lower housing element is the minor image of said upper housing element.

7. The apparatus according to claim 6, wherein said apertures in said upper and lower housing elements are aligned with said apertures in said upper and lower casings.

8. The apparatus according to claim 7, wherein said data storage device may be pivoted about said apertures through said longitudinal opening from a fully-enclosed position to a partially-enclosed position.

9. A bottle opening and data storage apparatus comprising:
  a hollow enclosure having a gripping member, said gripping member having a pair of gripping tabs for gripping a bottle cap, wherein said hollow enclosure further comprises:
    a partially-enclosed upper casing having a first end, a second end, a pair of opposed side walls, a top wall having an inner surface and an outer surface, an aperture disposed adjacent said first end in said top wall, an indentation in one of said side walls, and a longitudinal slot in one of said side walls; and
    a partially-enclosed lower casing attached to said partially-enclosed upper casing, said partially-enclosed lower casing having a first end, a second end, a pair of opposed side walls, a bottom wall having an inner surface and an outer surface, an aperture disposed adjacent said first end in said bottom wall, an indentation in one of said side walls, and a longitudinal slot in one of said side walls;
  and
  a data storage device pivotably attached to said hollow structure.

10. The apparatus according to claim 9, wherein said partially-enclosed lower casing is the mirror image of the partially-enclosed upper casing.

11. The apparatus according to claim 10, wherein said gripping member is mounted to the enclosure where the indentations adjoin each other.

12. The apparatus according to claim 10, further comprising a longitudinal opening where said longitudinal slots adjoin each other.

13. The apparatus according to claim 9, wherein said data storage device is movable between a fully-enclosed position within said hollow enclosure and a partially-enclosed position.

14. The apparatus according to claim 9, wherein said data storage device comprises:
  a base;
  a memory card; and
  a universal serial bus plug.

* * * * *